United States Patent [19]

Mantong

[11] Patent Number: 5,296,856
[45] Date of Patent: Mar. 22, 1994

[54] WINDOW TRACKING ADC

[76] Inventor: Frank L. Mantong, 9026 Acorn Ridge Cir., Elk Grove, Calif. 95758-5412

[21] Appl. No.: 28,699

[22] Filed: Mar. 4, 1993

[51] Int. Cl.[5] .......................................... H03M 1/18
[52] U.S. Cl. .................................... 341/139; 341/155
[58] Field of Search ............... 341/139, 122, 120, 155; 358/174

[56] References Cited

U.S. PATENT DOCUMENTS

| | | |
|---|---|---|
| 3,659,288 | 4/1972 | Taylor . |
| 4,122,800 | 6/1992 | Philipp . |
| 4,528,591 | 7/1985 | Liepe et al. ........................ 358/160 |
| 4,584,558 | 4/1986 | Maschek et al. ................... 341/139 |
| 4,641,246 | 3/1987 | Halbert . |
| 4,718,036 | 1/1988 | Halbert . |
| 4,807,147 | 2/1989 | Halbert . |
| 4,809,223 | 2/1989 | Brown . |
| 4,933,959 | 6/1990 | Knechtel . |
| 5,057,992 | 10/1991 | Traiger . |

OTHER PUBLICATIONS

Chu, David; "Phase Digitizing Sharpens Timing Measurements"; IEEE Spectrum; Jul. 1988.
Irvine, R.; "Tracking A/D Converter"; 1981; Operational Amplifier-Characteristics and Applications; pp. 223-225.

Primary Examiner—Brian K. Young
Attorney, Agent, or Firm—John P. O'Banion

[57] ABSTRACT

A window tracking analog to digital convertor (10) and method of signal conversion is disclosed. A sample and hold amplifier (16) samples an analog input signal and passes the sampled signal to a window comparator (20). The window comparator (20) analyzes the analog input signal to determine if its amplitude falls between upper and lower reference levels which establish a tracking "window." If the amplitude of the signal falls outside of the window, a control processor (34) and window reference tracker (24) adjusts the reference levels in the direction of the reference level which was exceeded until the analog input signal falls within the window, the adjusted reference level in the direction of adjustment representing the level of the sampled signal. A continuous interval timer (38) counts the amount of time that the analog input signal remained within the window. Once the window is adjusted, a digital output signal represented by the amplitude of the sampled signal and the number of timing intervals is sent an instrument such as a computer for use.

15 Claims, 7 Drawing Sheets

WINDOW TRACKING ADC

BACKGROUND OF THE INVENTION

1. Field of the Invention

This invention pertains generally to analog to digital converters and conversion techniques, and more particularly a window tracking apparatus and method for analog to digital conversion.

2. Description of the Background Art

Analog to digital converters are commonly employed to change an analog signal into a collection of digital data bits that accurately represent the signal. While the amplitude of the analog input signal can be continuously variable without discontinuity, the digital output signal into which it is physically changed will contain certain discontinuities which are characteristic of its digital form.

Conventional analog to digital converters measure the amplitude of an analog signal at a given instant during a sampling period and then change the signal to the closest digital form. Therefore, in order to provide for accurate digital representation of an analog signal, the digital form of the signal must change as the analog signal changes. If the sampling rate is too low, the digital form of the signal will not accurately represent the analog signal and low frequency aliasing can occur. It is generally accepted that, in order to convert an analog signal into a usable digital form without aliasing, the sampling rate must be at least twice the highest frequency component of the analog signal. However, the output of a conventional analog to digital converter will contain not only the digital form of the analog signal, but double sideband images of the analog signal centered at multiples of the sampling frequency. Therefore, the output signal must be filtered in order to make it usable. This can require the use of complex filters and filtering techniques in order to eliminate the sideband signals without eliminating a portion of the desired signal.

Furthermore, conventional analog to digital converters are subject to quantization error since, at each sampling instant, there will be a difference between the analog signal and the closest available digital representation. Resolution can be increased by increasing the number of data bits used, but data communications rates between the analog to digital converter and the device receiving the output signal are often limited. As a result, there are practical limitations to the accuracy of conventional analog to digital convertors.

Therefore, there is a need for an analog to digital conversion apparatus and method which overcomes the foregoing limitations of conventional devices. The present invention satisfies that need and overcomes the deficiencies in analog to digital convertors heretofore developed.

SUMMARY OF THE INVENTION

The present invention generally pertains to a window tracking analog to digital convertor and method of signal conversion. By way of example and not of limitation, a sample and hold amplifier samples an analog input signal and passes the sampled signal to a window comparator. The window comparator analyzes the signal to determine if its amplitude falls within upper and lower reference levels which establish a "window." If the amplitude of the signal falls outside of the window, an "out of limit" signal is generated. The out of limit signal is then analyzed by a programmable start delay comparator to determine if the frequency of the out of limit signal is too great. If the number of out of limit signals for a given time period is within preset criteria, the out of limit signal is sent to a control processor. Otherwise, the out of limit signal will be masked off and the control processor will not perform a conversion. While the signal is being sampled, a continuous interval timer counts the number of time intervals which have passed since the immediately preceding out of limit signal was generated. When the out of limit signal is received by the control processor, the control processor reads the number of time intervals, resets the continuous interval timer to zero and restarts the timer, and places the sample and hold amplifier into the hold mode. The control processor then controls a window reference tracker to move the window up and down, depending upon whether the analog input signal was above or below the window limits, until the signal falls within the window. In this manner, the upper and lower limits of the window move in tandem, with the window width generally remaining the same. Once the window is adjusted, the amplitude of the sampled signal and the number of timing intervals are sent to an instrument such as a computer for use, and the sample and hold amplifier is returned to the sample mode. Since each time interval is very short compared to a sampling period, and further since the amplitude of the signal is the same between the out of limit signals, the signal is effectively sampled at each time interval.

An object of the invention is to convert analog signals to digital form.

Another object of the invention is to provide for analog to digital conversion of signals without the need for filtering the digital signal in many applications.

Another object of the invention is to convert analog signals into digital signals with high precision time sampling.

Another object of the invention is to provide for analog to digital conversion of signals with a variable sampling rate.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DESCRIPTION OF THE PREFERRED EMBODIMENTS

Figure 1:
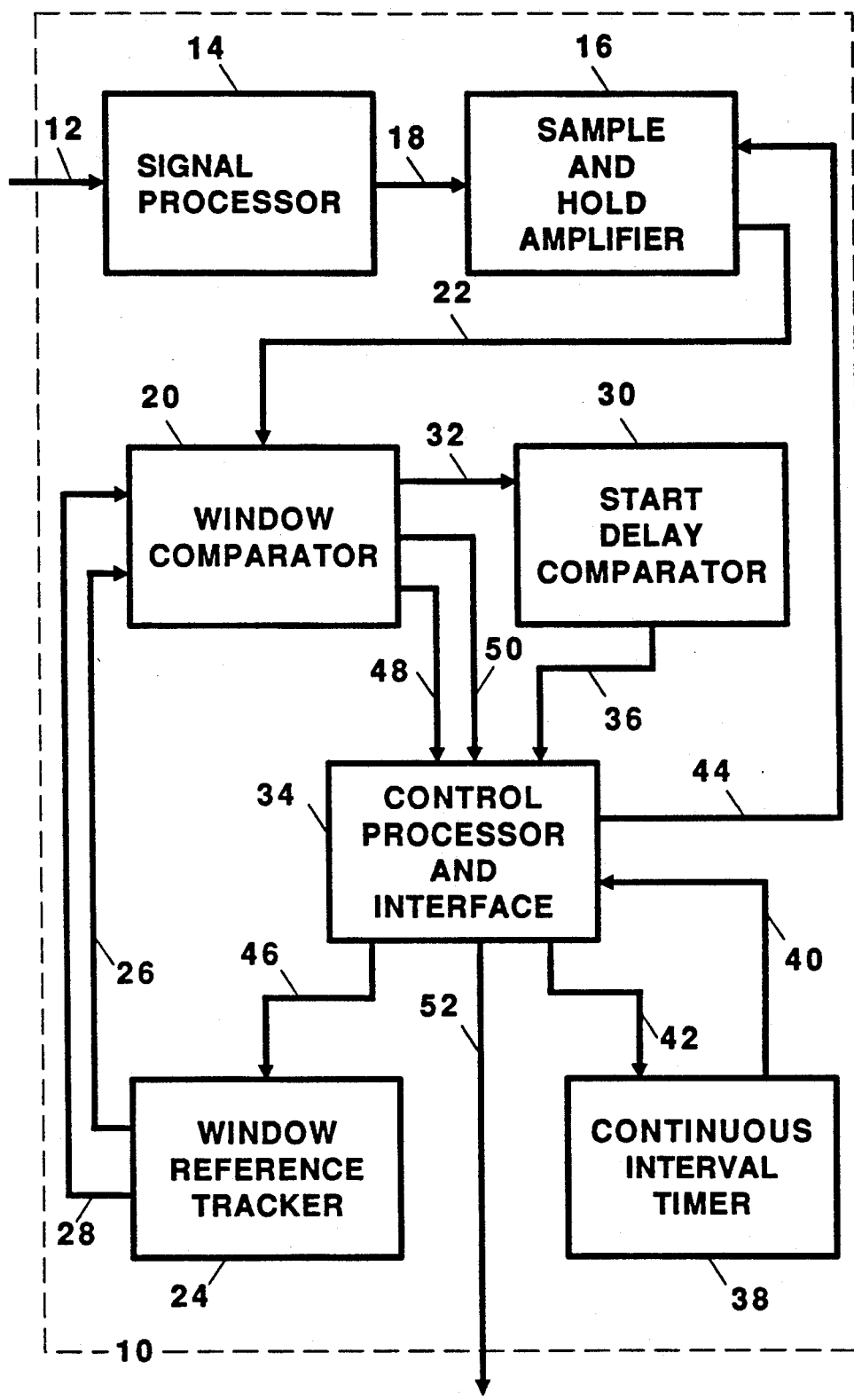
FIG. 1 is a block diagram showing the functional elements of the apparatus of the present invention.
Figure 5A:
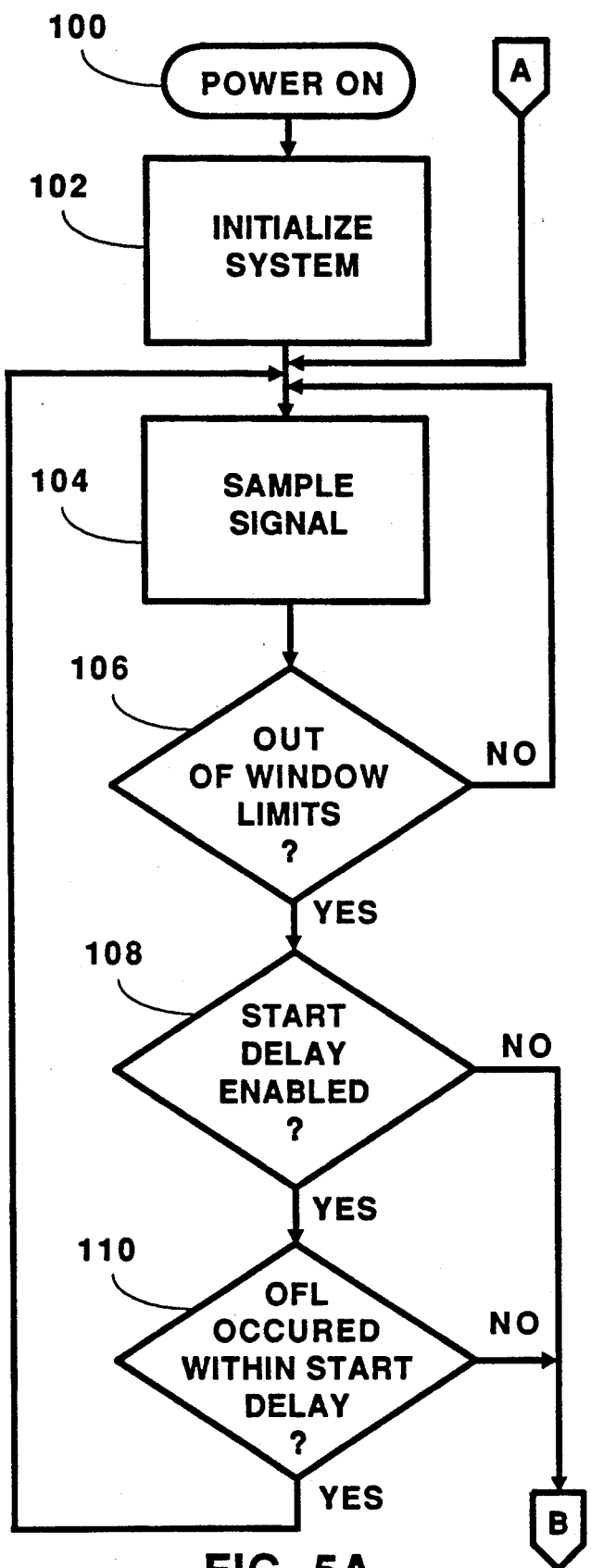
FIG. 5A through 5C is a flow chart showing the typical steps employed in the analog to digital signal conversion process of the present invention.
Figure 5B:
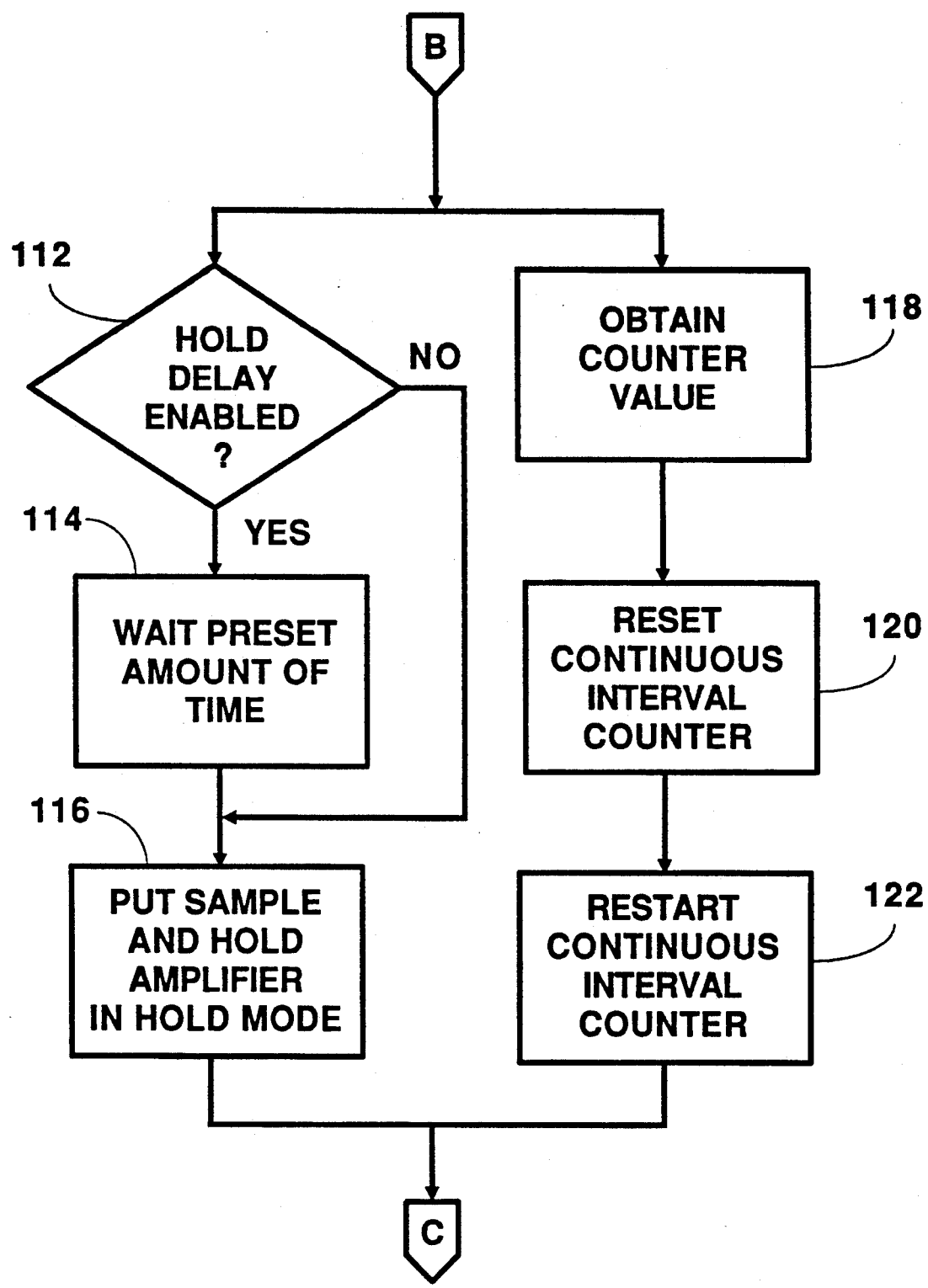
Figure 5C:
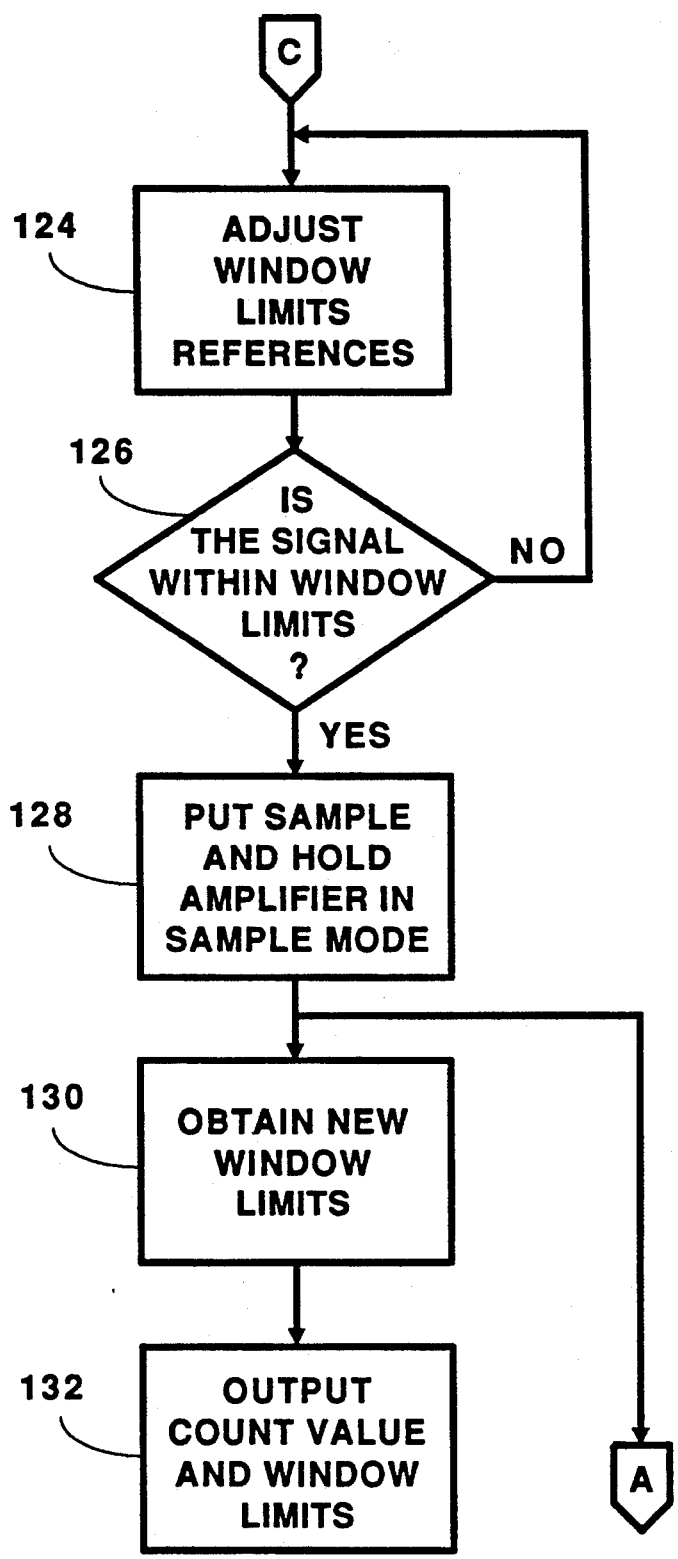

Referring more specifically to the drawings, for illustrative purposes the present invention is embodied in the apparatus generally shown in the functional block diagram of FIG. 1, and in the process generally shown in the flow chart of FIG. 5A through FIG. 5C. It will be appreciated that the apparatus may vary as to configuration and as to details of the parts, and that the process may vary as to the steps and their sequence, without departing from the basic concepts as disclosed herein.

Figure 2:
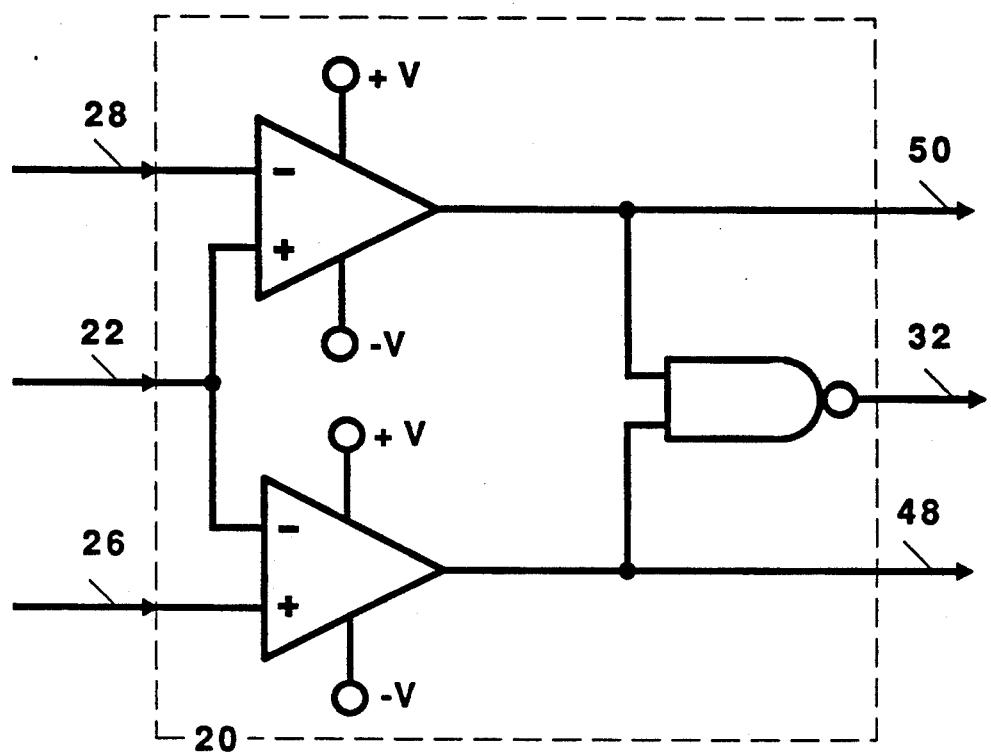
FIG. 2 is a schematic block diagram of one embodiment of the window comparator element of FIG. 1 which does not use hysteresis.
Figure 3:
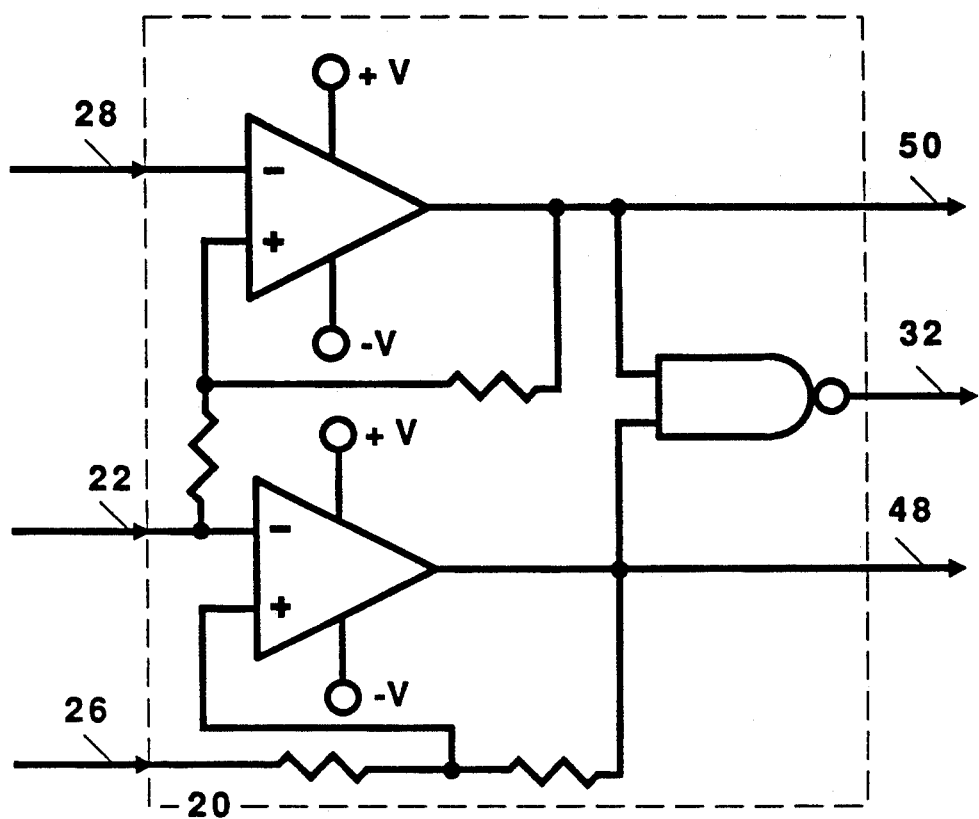
FIG. 3 is a schematic block diagram of an alternative embodiment of the window comparator element of FIG. 1 which uses hysteresis.

The preferred embodiment of the window tracking ADC converter 10 of the present invention can be seen with reference to FIG. 1. An analog input signal is received on interconnection 12 and processed by signal processor 14. Signal processor 14 is optional, and can be any conventional processing apparatus used to amplify, filter or shape the input signal, or to perform other pre-conversion processing. The processed analog input signal is then routed to a conventional sample and hold amplifier 16 through interconnection 18, as a means to sample the input signal and store the amplitude of the input signal upon command. The output of sample and hold amplifier 16 is routed to window comparator 20 through interconnection 22. Window comparator 20 receives upper and lower reference level signals from window reference tracker 24 through interconnections 26 and 28, respectively. These upper and lower reference level signals define a voltage "window" against which the input signal is compared. Window comparator 20 analyzes the input signal to determine if its amplitude falls within the window. FIG. 2 and FIG. 3 show examples of circuitry, without and with hysteresis, respectively, which can be employed for window comparator 20. The embodiment of FIG. 3 is preferred since use of hysteresis will reduce chattering which might occur when the input voltage is the same or very close to the reference voltage.

If the amplitude of the input signal falls outside of the window, an "out of limit" signal is generated and routed to start delay comparator 30 through interconnection 32. Start delay comparator 30 comprises conventional circuitry for determining the number of out of limit signals received for a given period of time which is programmable. The out of limit signal is analyzed by start delay comparator 30 to determine if the frequency of the out of limit signal exceeds predetermined criteria. If the number of out of limit signals for a given time period is within the preset criteria, the out of limit signal is sent to a control processor and interface 34 through interconnection 36. In other words, the out of limit signal will be sent to control processor and interface 34 only when the time period between it and an immediately preceding out of limit signal exceeds a predetermined time period (e.g., the frequency between two consecutive out of limit signals is lower than the preset criteria). Otherwise, the out of limit signal will be masked off and the control processor and interface 34 will not perform a conversion. Alternatively, start delay comparator 30 can be disabled to permit every out of limit signal to pass.

Control processor and interface 34 can be any conventional microprocessor, programmable system or the like, which can be programmed to perform the functions described herein as well as serve as a data interface to other control processors or instruments.

While the input signal is being sampled, a continuous interval timer 38 counts the number of time intervals which have passed since the immediately preceding out of limit signal was generated. When the out of limit signal is received by control processor and interface 34, control processor and interface 34 reads the number of time intervals through interconnection 40. Control processor and interface 34 then resets continuous interval timer 38 to zero and restarts the timer through interconnection 42, and places the sample and hold amplifier 18 into the hold mode through interconnection 44.

Figure 4:
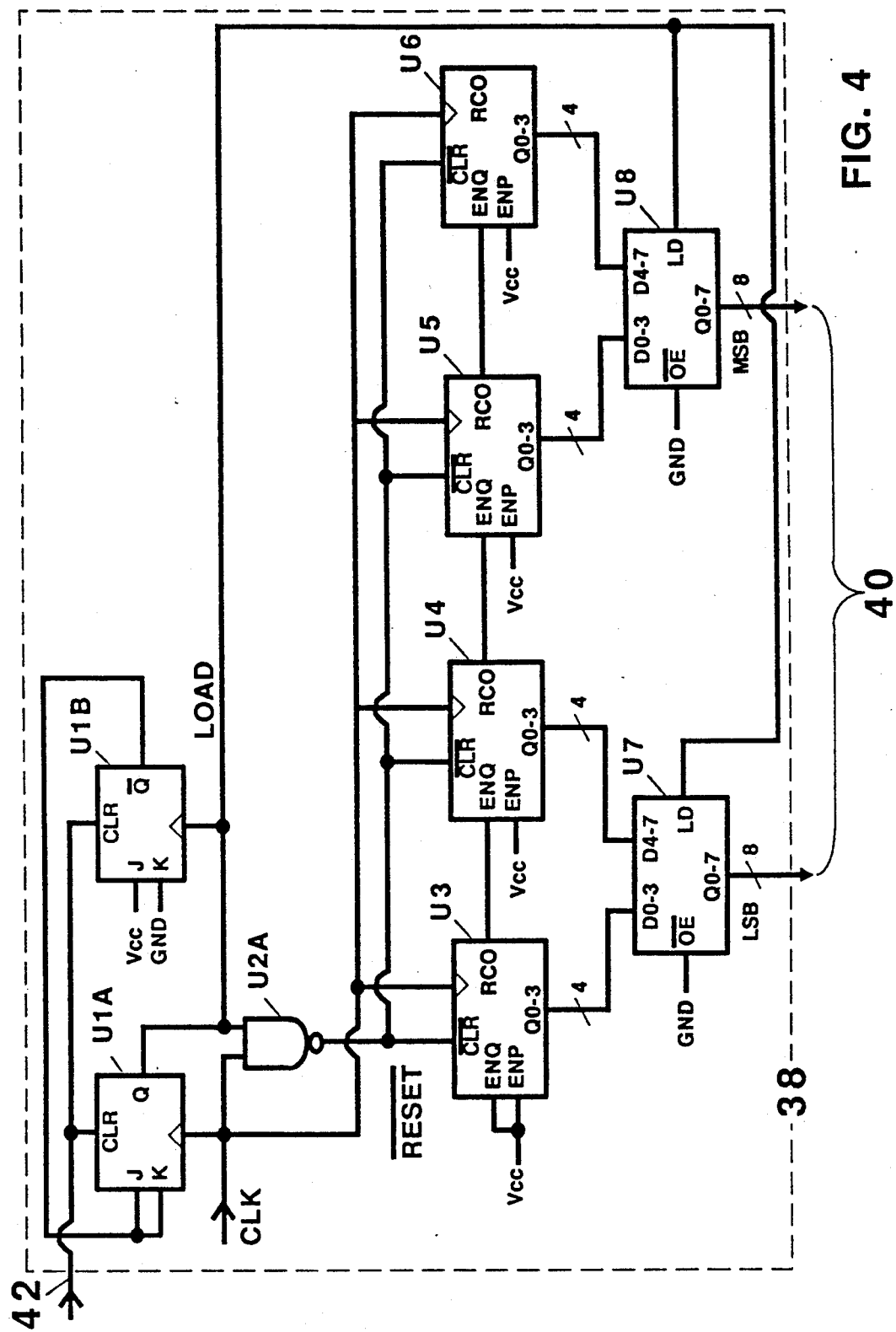
FIG. 4 is a schematic block diagram of the continuous interval timer element of FIG. 1.

FIG. 4 shows a functional block diagram of typical circuit elements which can be employed for continuous interval timer 38, which generally comprises a free running counter with an internal or external clock. This embodiment uses pulse triggered J-K flip flops such as a 74HC73 or equivalent for U1, synchronous 4-bit counters such as a 74HC161 or equivalent for U3 through U6, and data registers such as a 74HC574 or equivalent for U7 and U8. Control processor and interface 34 maintains interconnection 42 at a logic low when the analog input signal is within the window limits and a logic high when the analog input signal is outside the window limits. In this configuration, continuous interval timer 38 will continue to count until transition from a logic low to a logic high is detected on interconnection 42. When a low to high transition is detected, a load signal is internally generated and the count is loaded into the output register for reading by control processor and interface 34 on interconnection 40. The count is then reset to zero and continuous interval timer 38 is restarted. The frequency of the internal clock signal is selected based on the precision required by a particular application as well as the data width of continuous interval timer 38.

Since continuous interval timer 38 is free running, it is possible for an overflow to occur if the analog input signal remains within the window for a lengthy period of time. This condition is indicated by the presence of a "ripple carry output" (RCO) signal on the counters. To avoid this condition, it is preferred to monitor the overflow condition and to switch to a lower clock frequency when it occurs. If the overflow occurs again, then another clock frequency is used. For example, if a 1 MHz clock is used on an eight bit counter, overflow will occur after 255 microseconds. The overflow monitor would then switch to a different frequency such as 1 KHz in which case overflow will occur after 255 milliseconds. If overflow occurs again, the overflow monitor will switch to another frequency such as 1 Hz in which case overflow will occur after 255 seconds. If the last count read is "45", the total interval count will be 45 seconds + 255 milliseconds + 255 microseconds = 45.255255 seconds.

When an out of limit signal is received by control processor and interface 34, control processor and interface 34 performs the additional function of controlling window reference tracker 24 through interconnection 46 to search for a new window by adjusting the upper and/or lower limit of the window (depending on the type of adjustment method used as described herein), until the analog input signal falls within the window. Once window comparator 20 has stabilized, reference direction signals indicating whether the upper reference level was exceeded and whether lower reference level exceeds the analog input signal, are routed to control processor and interface 34 through interconnections 48 and 50, respectively. These signals are used by control processor and interface 34 to determine the direction of the reference level to be adjusted. While separate signal lines are preferred, an alternative would be to use one signal line with the logic state indicative of whether the upper or lower reference level was exceeded. In addition, both reference levels are preferably adjusted at the same time to maintain an appropriate window bandwidth throughout the conversion scale, which scale can be constant, arbitrary or logarithmic.

Window reference tracker 24 typically comprises a pair of conventional digital to analog convertors, one for each reference level. In this embodiment, the digital codes sent to window reference tracker 24 would translate directly to their analog equivalents and set window comparator 20 accordingly. Alternatively, window reference tracker 24 could include circuitry for mapping a digital code sent by control processor and interface 34 to any desired analog level for setting window comparator 20.

Once the window is adjusted, the last digital code or codes sent to window reference tracker 24 by control processor and interface 34 to move the window to include the analog input signal, as well as a digital code corresponding to the number of timing intervals between the out of limit signals, are available at interconnection 52 for processing by a computer, electronic instrument or the like. The digital codes will correspond to the amplitude of the analog input signal and the number of timing intervals will correspond to the time period over which the analog signal remained within the window. Therefore, the combination of the two represents a digital output signal corresponding to the analog input signal. Control processor and interface 34 then sends a control signal to sample and hold amplifier 18 to return to the sample mode.

Referring now to FIG. 5A, the conversion of an analog signal begins at step 100 by applying power to the window tracking ADC 10. At step 102, the apparatus is initialized. This step includes setting the upper and lower window limits to within an acceptable band for the signals to be converted since, if the window is too wide, no conversion will actually take place. Preferably the upper and lower limits are initially set to provide a window within which the lowest analog level will fall. This step can also include any desired pre-processing if a signal processor 14 is employed.

At step 104, the analog input signal is sampled by sample and hold amplifier 16 and passed to window comparator 20. At step 106, window comparator 20 analyzes the analog signal to determine if its level is above the upper reference level limit or below the lower reference level limit and, therefore, outside of the window. If the analog signal is within the window, the signal is again sampled at step 104. If the analog signal is outside of the window, an out of limit signal (OFL signal) is generated and passed to start delay comparator 30. At step 108, start delay comparator 30 is polled to determine if it is active. If start delay comparator 30 is not active, the conversion process jumps to steps 112 and 118 (FIG. 5B). Otherwise, the process continues at step 110.

In order to avoid over sampling, at step 110 start delay comparator 30 determines if time delay between the OFL signal and the immediately preceding OFL signal is within acceptable limits. Preferably, start delay comparator 30 is set to accept one OFL signal per fifty microsecond period but can be programmed for other time periods, which periods are determined as a function of the conversion time, signal frequency, and clock frequency of continuous interval timer 36. If more than one OFL signal has occurred within this period, the current OFL signal is "masked" off and the process returns to step 104 where the signal is sampled again. In other words, only the first OFL signal generated within the time period will be passed; the others will be masked off. However, during signal conversion when control processor and interface 34 is determining the new window references, the OFL signal is used to find the new window references until sample and hold amplifier 18 is placed back into the sample mode. Once window comparator 20 has stabilized, the OFL signal is used by control processor and interface 34 and the process continues at steps 112 and 118 (FIG. 5B).

Referring now to FIG. 5B, at step 112 control processor and interface 34 determines if a hold delay has been enabled. If so, the process continues at step 114 where control processor and interface 34 waits a predetermined period of time before placing sample and hold amplifier into a hold mode at step 116. These steps serve to avoid processing variations in signal levels due to glitches and which are not actual changes in the input signal. At step 118, control processor and interface 34 reads the counter value from continuous interval timer 38. Continuous interval timer 38 is then reset to zero at step 120 and automatically restarted at step 122.

Referring now to FIG. 5C, at step 124 control processor and interface 34 accesses window comparator 20 to determine whether the upper reference level limit or the lower reference level limit has been exceeded. The window is then adjusted in that direction by having control processor and interface 34 send one or more digital codes to window reference tracker 24. Where window reference tracker 24 comprises a pair of digital to analog converters as described herein, the digital codes sent would correspond to the upper and lower analog reference signals to be sent to window comparator 20 for adjustment of the window.

At step 126, the control processor and interface 34 checks to determine if an OFL signal is still present. If so, the process returns to step 124 for readjustment of the window. Once the window limits are adjusted to capture the analog input signal, sample and hold amplifier 18 is placed into the sample mode at step 128 so that a new variation in the analog input signal can be monitored at step 104. At step 130, control processor and interface 34 determines the new window levels. At step 132, control processor and interface 34 outputs the reference levels (upper and lower) which were adjusted, as well as the interval count or time period from continuous interval timer 38, to a device which will use the digital output signal.

As can be seen, the digital output signal comprises the digital codes corresponding to the adjusted reference levels (upper and lower) and the time period (number of intervals) over which analog input signal remained within the window prior to adjustment. Therefore, it should be noted that the manner in which the window levels are adjusted after an OFL signal is generated can impact the time required for conversion of the analog signal to a digital signal. However, several alternative methods can be employed without a noticeable effect on conversion accuracy.

In the preferred embodiment, the current window level is adjusted up or down by one incremental level depending upon which reference level was exceeded, by adjusting the upper and lower reference levels in tandem. This method maintains the voltage differential between the upper and lower reference levels at a substantially constant level; in other words, the width of the window remains substantially the same—the window simply moves up or down. Acceptable alternative methods of adjustment include (i) starting from the lowest level in the window range and incrementing up by one level at a time until the signal falls within the window; (ii) starting from the middle of the maximum window range and incrementing up or down by one level depending upon which reference level was exceeded; (iii) starting from the middle of the maximum window range and performing a binary search to find a window in which the signal falls; (iv) starting from the last window levels and performing a binary search to find a new window in which the signal falls; and (v) performing a successive approximation of window levels until the new window levels are found. Each of these methods can be implemented by adjusting the upper and lower reference levels in tandem (where the window width remains the same), or by independent adjustment of the reference levels (where the window width varies). Note also that, instead of the digital output signal containing multiple codes corresponding to the upper and lower reference levels, it could contain a single code which is externally mapped to a corresponding window level.

As can be seen therefore, continuous interval timer 38 counts the number of time intervals, which are the period of a high frequency clock, between two consecutive out of limit signals. Since the amplitude of the analog input signal stays within the window between any two consecutive out of limit signals, the signal amplitude and the number of time intervals which are available on interconnection 52 are representative of multiple samples from a conventional analog to digital converter having a constant sampling period equal to the time interval used in continuous interval timer 38. For example, an 8-bit embodiment of the present invention can convert an analog signal to digital form in 200 microseconds with a 16-bit continuous interval timer running with a 100 MHz clock. This provides a timer interval of 10 nanoseconds. When a signal is converted, the output of the present invention contains a signal amplitude and the number of time intervals which passed. If the signal amplitude code is "110" and the count value is "5000", this is equivalent to 5000 samples taken from a conventional analog to digital converter having a conversion rate of 100 MHz. A high speed 8-bit analog to digital converter would require complicated and expensive circuitry, whereas the present invention would provide for inexpensive circuitry. In addition, the data compression achieved by the present invention (e.g., 2 data points instead of 5000 data points) reduces the need for high speed communications channels between the apparatus and the a controller.

Accordingly, it will be seen that this invention presents an apparatus and method for accurate and reliable conversion of an analog signal into a digital signal which is both novel and nonobvious. Although the description above contains many specificities, these should not be construed as limiting the scope of the invention but as merely providing illustrations of some of the presently preferred embodiments of this invention. Thus the scope of this invention should be determined by the appended claims and their legal equivalents.

I claim:

1. A method of converting an analog input signal into a digital output signal, comprising the steps of:
   (a) sampling an analog input signal to be converted, said analog input signal having an amplitude;
   (b) comparing said amplitude of said sampled analog input signal to a voltage window defined by an upper reference voltage and a lower reference voltage;
   (c) generating an out of limit signal in response to said amplitude of said sampled analog input signal falling outside said voltage window;
   (d) adjusting, in response to said out of limit signal, said voltage window until said amplitude of said sampled analog input signal is within said voltage window;
   (e) generating a plurality of periodic timing signals;
   (f) counting said timing signals and generating a first output signal indicative of the number of timing signals occurring between said out of limit signal and an immediately preceding out of limit signal; and
   (g) generating a second output signal indicative of said adjusted voltage window, said second output signal corresponding to said amplitude of said sampled analog input signal.

2. A method as recited in claim 1, further comprising the steps of:
   (a) generating a first reference direction signal in response to said amplitude of said sampled analog input signal exceeding said upper reference voltage;
   (b) generating a second reference direction signal in response to said amplitude of said sampled analog input signal falling below said lower reference voltage; and
   (c) adjusting, in response to one of said reference direction signals, said voltage window in a direction corresponding to said one of said reference direction signals.

3. A method as recited in claim 2, wherein consecutive out of limit signals are separated by a time delay, and further comprising the step of comparing said time delay between consecutive out of limit signals to a predetermined time period and masking at least one of said out of limit signals in response to said predetermined time period exceeding said time delay.

4. A method as recited in claim 2, wherein said step of adjusting said voltage window comprises the step of adjusting said upper reference voltage and said lower reference voltage in tandem wherein a voltage differential between said reference voltages remains substantially constant.

5. A method as recited in claim 2, wherein said step of adjusting said voltage window comprises the step of independently adjusting said upper reference voltage and said lower reference voltage.

6. A method of analog to digital voltage signal conversion, comprising the steps of:
   (a) comparing an analog voltage signal to an upper reference voltage;
   (b) comparing said analog voltage signal to a lower reference voltage;
   (c) in response to said analog voltage signal exceeding said upper reference voltage, generating an out of limit signal and increasing said upper reference voltage to a level at least equal to said analog voltage signal;

(d) in response to said lower reference voltage exceeding said analog voltage signal, generating an out of limit signal and decreasing said lower reference voltage to a level at least equal to said analog voltage signal;

(e) generating a plurality of periodic timing signals;

(f) counting said timing signals and generating a first output signal indicative of the number of timing signals occurring between consecutive out of limit signals; and (g) generating a second output signal indicative of said adjusted upper and lower reference voltages, said second output signal corresponding to the amplitude of said analog input signal.

7. A method as recited in claim 6, wherein consecutive out of limit signals are separated by a time delay, and further comprising the step of comparing said time delay between consecutive out of limit signals to a predetermined time period and masking at least one of said out of limit signals in response to said predetermined time period exceeding said time delay.

8. A method as recited in claim 6, further comprising the steps of:

(a) adjusting said lower reference voltage in an amount and direction corresponding to adjustment of said upper reference voltage; and (b) adjusting said upper reference voltage in an amount and direction corresponding to adjustment of said lower reference voltage.

9. An apparatus for converting an analog signal into digital form, comprising:

(a) signal sampling means for sampling an analog input signal to be converted, said analog signal having a voltage level;

(b) comparator means for comparing said analog input signal to a voltage window and generating an out of limit signal in response to said analog input signal having a voltage level outside said voltage window, said voltage window defined by an upper reference voltage and a lower reference voltage;

(c) reference tracker means for adjusting said voltage window until said voltage level of said analog input signal is within said window, said reference tracker means responsive to said out of limit signal;

(d) timer means for generating a plurality of periodic timing signals; and (e) processor means for counting the number of timing signals occurring between consecutive out of limit signals and generating a first output signal indicative thereof and for generating a second output signal indicative of said voltage level of said analog input signal.

10. An apparatus as recited in claim 9, further comprising:

(a) means for generating a first reference direction signal in response to said voltage level of said analog input signal exceeding said upper reference voltage;

(b) means for generating a second reference direction signal in response to said voltage level of said analog input signal falling below said lower reference voltage; and (c) means for adjusting, in response to one of said reference direction signals, said voltage window in a direction corresponding to said one of said reference direction signals.

11. An apparatus as recited in claim 10, further comprising means for adjusting said upper reference voltage and said lower reference voltage in tandem wherein a voltage differential between said reference voltages remains substantially constant.

12. An apparatus as recited in claim 10, wherein consecutive out of limit signals are separated by a time delay and further comprising means for comparing said time delay between said out of limit signal and an immediately preceding out of limit signal with a predetermined time period and masking at least one of said out of limit signals in response to said predetermined time period exceeding said time delay.

13. An analog to digital convertor, comprising:

(a) means for comparing an analog voltage signal to an upper reference voltage;

(b) means for comparing said analog voltage signal to a lower reference voltage;

(c) means for generating an out of limit signal and increasing said upper reference voltage to a level at least equal to said analog voltage signal in response to said analog voltage signal exceeding said upper reference voltage;

(d) means for generating an out of limit signal and decreasing said lower reference voltage to a level at least equal to said analog voltage signal in response to said lower reference voltage exceeding said analog voltage signal;

(e) means for generating a plurality of periodic timing signals;

(f) means for counting said timing signals and generating a first output signal indicative of the number of timing signals occurring between consecutive out of limit signals; and (g) means for generating a second output signal indicative of said adjusted upper and lower reference voltages, said second output signal corresponding to the amplitude of said analog input signal.

14. An apparatus as recited in claim 13, wherein consecutive out of limit signals are separated by a time delay, and further comprising means for comparing said time delay between consecutive out of limit signals to a predetermined time period and masking at least one of said out of limit signals in response to said predetermined time period exceeding said time delay.

15. An apparatus as recited in claim 14, further comprising:

(a) means for adjusting said lower reference voltage in an amount and direction corresponding to adjustment of said upper reference voltage; and (b) means for adjusting said upper reference voltage in an amount and direction corresponding to adjustment of said lower reference voltage.

* * * * *